United States Patent [19]
Lesk

[11] Patent Number: 5,908,321
[45] Date of Patent: Jun. 1, 1999

[54] SEMICONDUCTOR STRUCTURE WITH STABLE PRE-REACTED PARTICLE AND METHOD FOR MAKING

[75] Inventor: Israel A. Lesk, Phoenix, Ariz.

[73] Assignee: Motorola, Inc., Schaumburg, Ill.

[21] Appl. No.: 08/863,270

[22] Filed: May 27, 1997

Related U.S. Application Data

[63] Continuation of application No. 08/178,159, Jan. 6, 1994, abandoned.

[51] Int. Cl.$^6$ .......................... H01L 21/31; H01L 21/336; H01L 21/443
[52] U.S. Cl. .......................... 438/787; 438/158; 438/694; 438/761
[58] Field of Search .................................... 438/158, 694, 438/761, 787

[56] References Cited

U.S. PATENT DOCUMENTS

| | | | |
|---|---|---|---|
| 4,309,240 | 1/1982 | Zaferes | 438/784 |
| 4,735,919 | 4/1988 | Faraone | 438/260 |
| 5,024,962 | 6/1991 | Murray et al. | 438/158 |
| 5,051,380 | 9/1991 | Maeda et al. | 438/761 |
| 5,223,443 | 6/1993 | Chinn et al. | 438/694 |
| 5,322,807 | 6/1994 | Chen et al. | 438/158 |
| 5,393,708 | 2/1995 | Hsia et al. | 438/761 |
| 5,399,389 | 3/1995 | Hieber et al. | 438/761 |
| 5,484,749 | 1/1996 | Maeda et al. | 438/761 |

FOREIGN PATENT DOCUMENTS 61-36936 2/1986 Japan .

OTHER PUBLICATIONS

S. Wolf and R.N. Tauber, Silicon Processing for the VLSI Era, vol. 1–Process Technology, 1986, Lattice Press, pp. 57–58, 208.

B.G. Streetman, Solid State Electronic Devices, $2^{nd}$ Ed., 1980, Prentice–Hall, pp. 321–322.

*Primary Examiner*—Olik Chaudhuri
*Assistant Examiner*—Alonzo Chambliss
*Attorney, Agent, or Firm*—George C. Chen

[57] ABSTRACT

A method for making a semiconductor structure which may be subject to small particle contaminants (12) includes pre-reacting the small particle (12) with a substrate (10) at a reaction temperature (27, 28). Pre-reacting the particle's (12) greatly reduces the particles' susceptibility to further reaction during subsequent processing, particularly gate dielectric formation. Consequently, the pre-reacted particle (13) as well as the remainder of the structure surface (11) can be covered with a high quality conformal deposited dielectric (14) which maintains a uniform thickness. Potential localized high leakage current density regions are thereby reduced. Additionally, an undesirably thin gate oxide region (70) adjacent a thick field oxide region (66) of a typical MOS structure is eliminated. Yield and reliability are thereby enhanced.

20 Claims, 2 Drawing Sheets

SEMICONDUCTOR STRUCTURE WITH STABLE PRE-REACTED PARTICLE AND METHOD FOR MAKING

This application is a continuation of prior application Ser. No. 08/178,159, filed Jan. 6, 1994, now abandoned.

BACKGROUND OF THE INVENTION

The present invention relates to semiconductor structures, and more particularly to semiconductor structures having particles on a semiconductor substrate surface.

A class of solid state devices commonly used in manufacturing integrated circuits is known as the MOS or MIS transistor. The name derives from their basic structure which employs a semiconductor substrate such as silicon or gallium arsenide called "S", a conductive gate electrode usually made of polycrystalline (poly) silicon or metal called "M", and in between the two an insulating layer called "I" which is often comprised of silicon dioxide called "O". Large chips such as multi-megabit memories utilize millions of MOS transistors, all of which must work reliably within specification limits.

It is important to note that the insulating layer in an MOS transistor is very thin, often less than 150 Å thick, and it is generally formed by heating the silicon substrate in an oxidizing atmosphere. In the liquid chemicals used for etching, cleaning and washing, and in the equipment and the supply gases used for oxidation there are particulates. Some of these particulates will remain on the surface of a silicon wafer when it is ready to begin its high temperature oxidation cycle. Particulates smaller than 3500 Å are not detectable by production-compatible techniques. These small particulates are still very large compared to the oxide thickness to be grown. Accordingly, a small particle on the silicon surface during a thermal oxidation cycle can cause a large localized perturbation in oxide properties.

For example, refractory particulates may simply tend to mask the oxidation process; if a particulate is subsequently removed, a thin spot in the oxide remains. Metallic particulates will tend to react with the silicon and oxygen, producing a region that is not the desired $SiO_2$ insulator, but rather a metal-silicon-oxygen composite. If a defective region in the insulator of a device is large enough, its MOS I-V characteristic will exhibit higher leakage current than the rest of the device; this is measurable. However, in most cases the dielectric defect is so small that even though the current density flowing through it is very high compared to the rest of the MOS structure, its current is less than that carried by the remaining undefected structure. For example, a 100 Å defect carrying $10^4$ times as much current density would be unnoticed in a 20 $\mu m^2$ MOS device.

Nevertheless, $SiO_2$ exhibits a well-known wear-out phenomenon; it breaks down electrically as a result of electric current flowing through it. Breakdown depends upon how much electronic charge density, e.g. coulombs per $cm^3$, has passed through the insulator. For steady state conditions, this equals current density times time. This is called the charge-to-breakdown, or $Q_{BD}$, effect. Accordingly, an MOS chip may pass final test, but fail burn in or exhibit field failure as a result of a small particle-induced, electrically-invisible defect in the gate oxide of one of its thin dielectric MOS regions.

Consequently, what is needed is a method for minimizing the undesirable impact and consequences of small particles in semiconductor processes.

DETAILED DESCRIPTION OF THE DRAWINGS

Figure 1:
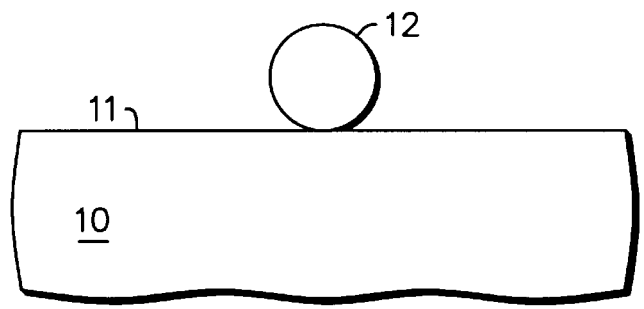
FIGS. 1–5 are simplified cross-section side views illustrating a semiconductor structure during progressive steps of processing.

Particulate contamination of a wafer is always present to some degree in the processing of semiconductor devices and integrated circuits. Contamination occurs when the semiconductor substrate is directly exposed to its environment, gaseous or liquid, at times during the process flow, as in the case of silicon preparatory to thermal oxidation.

Particulates present on the exposed silicon surface can be of various types, such as organics, metallics and refractories. Each type presents certain problems. During a thermal oxidation cycle, organic particles will at least partially burn off leaving a localized residue that can become incorporated in the $SiO_2$. Metallics such as steel, aluminum and copper will react with both the silicon substrate and the oxygen ambient during oxidation, producing a localized metal-silicon-oxygen mixture instead of the desired thermal oxide. Refractories such as silicon, aluminum oxide and silicon carbide can react to some extent with the oxidizing atmosphere and can partially mask oxidation of the substrate on a local basis. When refractory particles break off subsequent to at least part of the oxidation cycle, a thin spot in the thermal oxide will result.

When regions of a silicon substrate are exposed, a conformal oxide ($SiO_2$) may be applied to the surface for example by deposition from a gas mixture. This will result in a uniform thickness of insulator on the silicon wafer surface and over the contaminating particulates. Such $SiO_2$ layers may be deposited at low temperatures by plasma-enhanced chemical vapor deposition (PECVD). For example, tetraethylorthosilicate (TEOS) may be decomposed at 300–400° C. in a plasma or at 650–800° C. thermally. In neither case, however, is the deposited $SiO_2$ film of sufficient quality to be used as the gate dielectric in an MOS transistor.

One way to improve $SiO_2$ quality might be to subject the deposited $SiO_2$ to a high-temperature cycle after deposition. This heating cycle may be performed in a furnace at 800–1000° C. or in a rapid thermal anneal (RTA) machine in the range of 900–1100° C., in an oxidizing atmosphere. Unfortunately, when post-deposition heating is performed, particulates trapped on the Si substrate under the deposited $SiO_2$ layer can react with silicon and $SiO_2$ to produce localized regions of a composition other than $SiO_2$. These regions of local modification of the gate oxide will provide electrical paths between gate and substrate, in parallel to the major oxide area, that can result in degraded reliability and, if sufficiently extensive, degraded performance.

However, if, in accordance with one embodiment of the present invention, the particulates on a silicon surface are "pre-reacted" with the silicon, for example by heating in an essentially non-oxidizing atmosphere, they may be converted into chemical compounds or mixtures that are immune to change during subsequent processing. When the pre-reacted particles are subsequently covered by deposited $SiO_2$, the $SiO_2$ layer will remain essentially unchanged during its post-deposition thermal processing, gate conductor deposition and all further process steps. In this way a full thickness of gate oxide is maintained over the pre-reacted particulates as well as over exposed silicon regions. Additionally, the deposited dielectric will help to keep particulates in place, preventing their motion that would expose thin oxide regions beneath them.

Turning to the figures for a more detailed understanding, FIG. 1 illustrates a portion of semiconductor substrate 10 part way through the process sequence for making MOS devices or integrated circuits. In the preferred embodiment, substrate 10 is silicon. A portion of the upper surface 11 of the silicon substrate has been etched clean of all other layers of materials, such as $SiO_2$ and $Si_3N_4$, and is now exposed to its ambient atmosphere. A particle 12 of some material has landed on the silicon surface 11. Such contaminating particles can come from gases and liquids used in the processing of semiconductor wafers and may consist of a variety of materials such as organics, metals, and refractory materials.

According to one embodiment of the invention, the semiconductor substrate 10 is heated in an essentially non-oxidizing atmosphere to "pre-react" the particulate 12 with the substrate 10 where they contact one another. This may be accomplished at 800–1000° C. in a furnace for 30 minutes, or in an RTA machine at 1000–1100° C. for 5 minutes. It is generally desirable to add about 1% $O_2$ to the inert atmosphere, $N_2$ or Ar, during the particle prereaction step to prevent pitting of an exposed Si surface 11.

Figure 2:
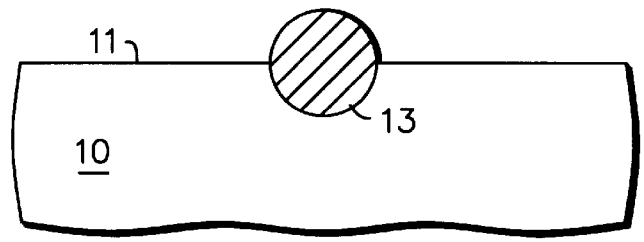

Different materials will react with the substrate in different ways at a high temperature. Metal particulates will generally react metallurgically with a silicon substrate, producing an alloy region 13 in FIG. 2. By performing this inert atmosphere heating at a high temperature, the resulting stable pre-reacted particle 13 will not react further during subsequent processing of the silicon wafer which generally will not exceed 900° C.

Figure 3:
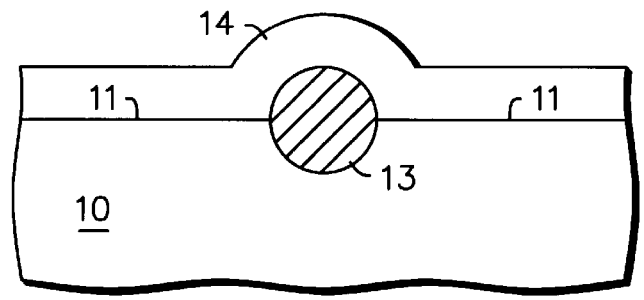

Turning to FIG. 3, a gate dielectric layer 14 is deposited on the semiconductor substrate 10, covering its surface 11 and the stable pre-reacted particle 13 with a uniform thickness layer 14. This deposition may be considered a conformal coating. TEOS may be used for this purpose, decomposing it at 300–400° C. in a plasma or thermally at 650–800° C. to give a conformal coating of $SiO_2$ with thicknesses in the range of 50–250 Å. As a general rule, $SiO_2$ deposited from TEOS in the higher temperature CVD mode, 650–800° C., gives a higher quality $SiO_2$ layer than that deposited by PECVD at lower temperatures.

Figure 4:
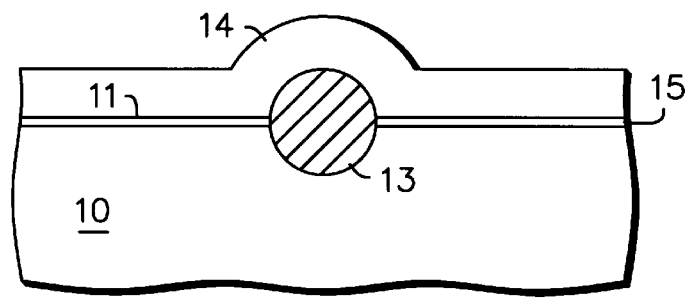

Turning to FIG. 4, the quality of deposited $SiO_2$ layer 14 can generally be improved by heating above its deposition temperature. Additionally, the quality of the interface between deposited $SiO_2$ layer 14 and Si substrate 10 is improved by incorporating into it a thin thermally grown $SiO_2$ layer 15. Both of these improvements can be accomplished by heating the structure of FIG. 3 in an oxidizing atmosphere, for example 10% $O_2$ in Ar, at 900 C. for 1 hour.

Figure 5:
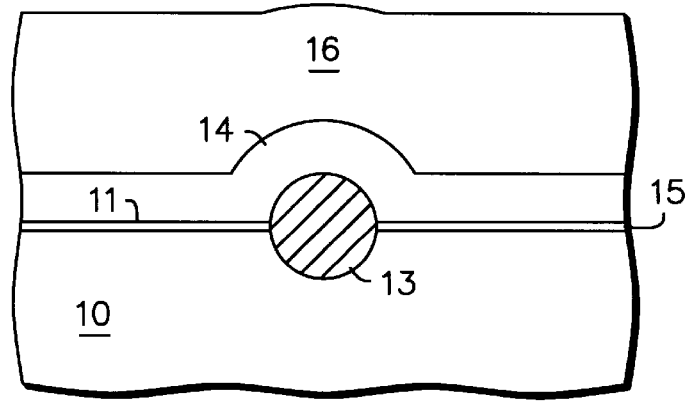

Turning to FIG. 5, a conductive gate layer 16, commonly doped polysilicon, is applied over the uniform thickness gate dielectric layer 14. Further processing proceeds as in any MOS flow. The gate of the device will comprise a polysilicon layer 16.

As shown in FIG. 5, there is a constant thickness gate dielectric layer 14 everywhere between the gate 16 and the substrate 10. This layer prevents excessive current flow from gate 16 to substrate 10 through stable pre-reacted particle 13.

Figure 6:
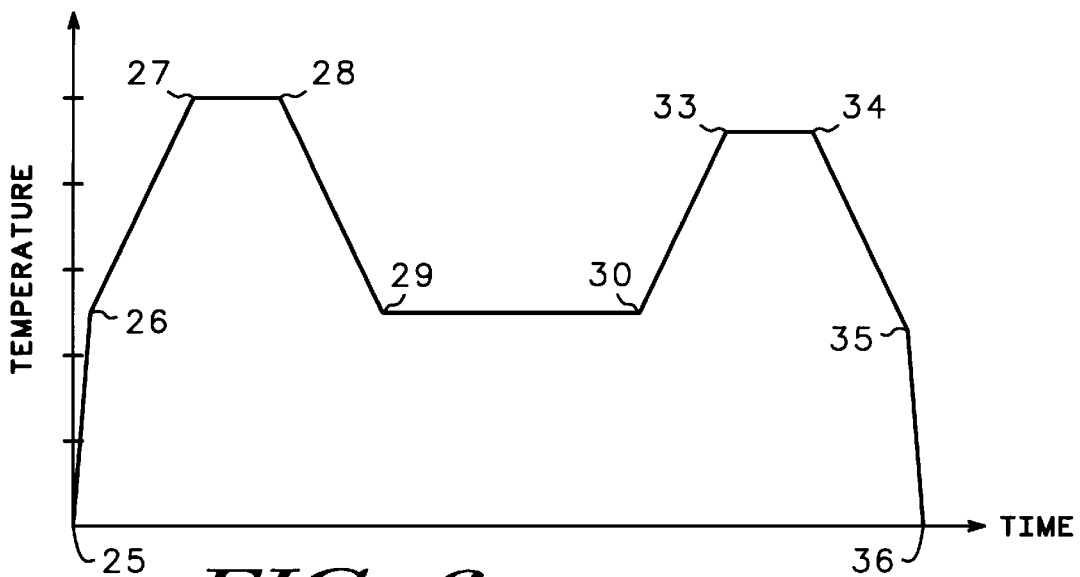
FIG. 6 is a temperature/time graph illustrating one process in accordance with the present invention.

A temperature-time diagram suitable for producing the structure of FIG. 5 is illustrated in FIG. 6. Referring to FIG. 6, a reaction region consists of the segment between point 25 and point 29. In this segment, a boat of wafers is rapidly pushed into the furnace between points 25 and 26. Between points 26 and 27, the temperature is ramped in an essentially non-oxidizing atmosphere to the reaction temperature. Between points 27 and 28, time is provided at the reaction temperature to assure that the pre-reacted particle 13 (FIG. 2) is completely reacted. Between points 28 and 29, the temperature is ramped down to a temperature suitable for deposition of a gate dielectric. In one embodiment of the present invention, the reaction temperature between points 27 and 28 could be 800–1000° C. in a furnace or 1000–1100° C. in an RTA machine. In either case, a suitable ambient comprises an oxygen concentration of less than about 1% oxygen in Argon.

The segment between points 29 and 30 is the dielectric deposition region. Between points 29 and 30, the gate dielectric 14 (FIG. 3) is deposited. According to the preferred method, TEOS may be used for deposition in a plasma at 300–400° C. or thermally at 650–800° C. Gas composition and temperature are established to permit deposition of a closely controlled thickness of dielectric in a reasonably short time, e.g., one hour. Thickness control of better than 10% is achieved by utilizing temperatures toward the low end of the range, where deposition rates are low.

The segment between points 30 and 33 is considered a heating region. Between points 30 and 33, temperature is ramped up to cause densification of the dielectric layer 14, which improves the quality of the layer. The temperature is maintained between points 33 and 34, allowing the densification to take place. Additionally, during this heat treatment the interface between the deposited layer 14 (FIG. 4) and the substrate 10 is converted to a thermal oxide layer 15, improving the quality of the interface. During this heat treatment, an oxidizing ambient is used, such as 10% or greater oxygen in nitrogen.

Preferably, the heat cycle peak between points 33 and 34 is kept more than approximately 100° C. below the peak reaction temperature between points 27 and 28. This assures that no additional reaction of consequence between pre-reacted particle 13 and substrate 10 takes place. An appropriate heating cycle for the period between 33 and 34 could be 900° C. for 30 in a furnace, or 1000° C. for 5 minutes in an RTA machine.

Between points 34 and 35, the temperature is ramped down, and between points 35 and 36 the wafers are rapidly withdrawn from the furnace.

It is notable that, due to the initial reaction step (including segment 27 to 28) followed by the heating step (including segment 33 to 34), the temperature-time profile of FIG. 6 displays a "double-hump" shape, with the left hump somewhat higher than right one.

Figure 7:
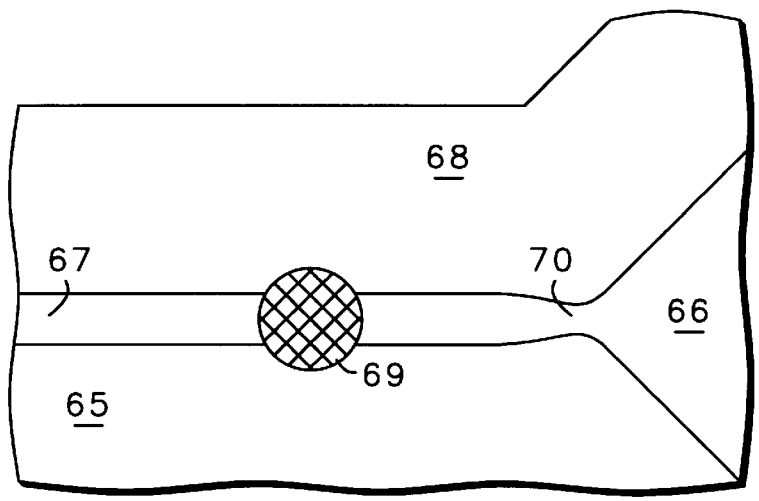
FIG. 7 is a simplified cross-section side view illustrating a semiconductor structure of the prior art.
Figure 8:
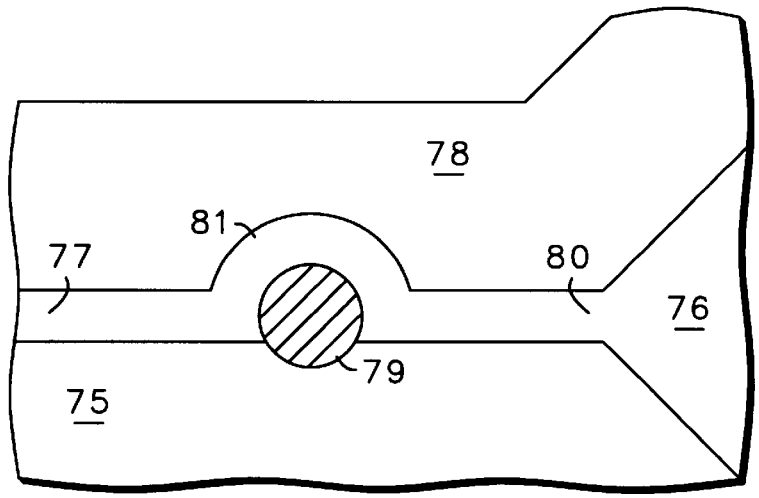
FIG. 8 is a simplified cross-section side view illustrating a semiconductor structure made in accordance with a particular embodiment of the present invention.

FIGS. 7 and 8 illustrate one particularly useful application of one embodiment of the present invention. It will be understood by those having average knowledge of the industry that silicon devices and integrated circuits are by far the most commonly manufactured today. The majority of such devices use a thick thermal $SiO_2$, called a field oxide region, for isolation purposes. FIGS. 7 and 8 compare present technology with the results of one embodiment of the present invention, in a region close to the intersection of gate and field oxide regions.

More specifically, FIG. 7 represents conventional technology, comprising a silicon wafer or substrate 65 into which a thick $SiO_2$ field region 66 has been grown by thermal oxidation masked by a patterned silicon nitride layer. A thermal gate oxide 67 is grown on substrate 65. During growth, and including any anneal cycle of gate oxide 67, a contaminating particulate on the exposed substrate has reacted with the substrate, ambient oxygen, and grown oxide to produce a metallurgically reacted region 69 that locally connects gate region 68 to substrate 65 with a high-current density but low-current path. In addition, at least as a partial consequence of mechanical stresses at the edge 70 of the field oxide, thermal gate oxide growth is slower at edge 70, resulting in a localized gate oxide thinning of up to about 30%. The thin oxide at edge 70 also results in a much higher localized electronic current density flowing from gate 68 to substrate 65 through region 70 than through the rest of the gate oxide 67.

By comparison, FIG. 8 depicts the same region as FIG. 7, but contrasts the new geometry produced by one embodiment of the present invention. A pre-reacted particulate 79 is partially embedded in substrate 75. The degree of penetration of pre-reacted particulate 79 will depend upon the composition of the particle and can vary from extreme as illustrated in FIG. 8 to non-existent. Pre-reacted particulate 79 and the surface of substrate 75 are covered with the same thickness of gate dielectric 77, which is present everywhere between gate 78 and substrate 75. At the edge 80 of the field oxide 76 the gate oxide 77 is no thinner than anywhere else. The presence of a full thickness of gate oxide 77 between gate region 78 and substrate 75 eliminates localized regions of very high electronic current density flowing from gate to substrate when a voltage is applied between them. The results are improved reliability and yield.

It should now be appreciated that a method has been provided which reduces the problem of undesirable high current density regions caused by small particle contaminants during semiconductor structure processing. By pre-reacting the particulates with the substrate and then covering them, as well as the rest of the wafer surface, with a high quality conformal deposited gate dielectric, potential localized high leakage current density regions are blocked off. In addition, thin gate oxide regions adjacent to thick field oxide edges, commonly observed with standard processing, are eliminated. This also contributes to enhanced yield and reliability.

I claim:

1. A method for making a semiconductor device comprising the steps of:

reacting, in an essentially non-oxidizing atmosphere, a particle at a first temperature sufficient to react the particle with a substrate underlying the particle;

subsequently cooling the particle and the substrate to a second temperature suitable for depositing a dielectric layer; and subsequently depositing the dielectric layer to a substantially constant thickness over both the particle and a region of the substrate adjacent to the particle.

2. The method of claim 1, further comprising the step of heating the semiconductor substrate, thereby forming a thermal oxide layer between the substrate and the dielectric layer.

3. The method of claim 2, wherein the step of heating comprises rapid thermal annealing.

4. The method of claim 2, wherein the step of heating comprises heating in an atmosphere containing oxygen.

5. The method of claim 2, wherein the step of heating comprises heating to a third temperature which is more than 100° C. lower than the first temperature wherein the third temperature is higher than the second temperature.

6. The method of claim 1, wherein the step of reacting comprises a rapid thermal anneal at a temperature in the range of 1000–1100° C.

7. The method of claim 1, wherein the step of subsequently depositing the dielectric layer comprises depositing $SiO_2$ from TEOS.

8. The method of claim 1, wherein the step of subsequently depositing the dielectric layer comprises conformally depositing the dielectric layer over both the particle and the region of the substrate adjacent the particle.

9. The method of claim 1, further comprising the step of depositing a conductive layer over the dielectric layer.

10. The method of claim 9, wherein the step of depositing the conductive layer comprises depositing polysilicon.

11. The method of claim 1 wherein the step of reacting the particle includes reacting the particle with the substrate while the particle and a surface of the substrate supporting the particle are exposed.

12. The method of claim 1 wherein the step of reacting the particle includes preventing a substantial deposition of a film over the entire substrate and preventing a substantial growth of a film over the entire substrate.

13. The method of claim 1 wherein the step of reacting the particle includes using the particle to form an alloy region wherein a portion of the alloy region is located beneath a surface of the substrate.

14. The method of claim 1 wherein the step of subsequently depositing the dielectric layer includes providing a thickness uniformity of approximately ten percent for the substantially constant thickness.

15. The method of claim 1 wherein the step of subsequently depositing the dielectric layer includes providing a thickness of approximately 50–80 angstroms for the dielectric layer.

16. The method of claim 1 further comprising the step of forming a field oxide region in the substrate before the step of subsequently depositing the dielectric layer wherein the step of subsequently depositing the dielectric layer includes depositing the dielectric layer contiguous to the field oxide region.

17. The method of claim 16 wherein the step of subsequently depositing the dielectric layer includes depositing a portion of the dielectric layer between the particle and the field oxide region wherein the portion of the dielectric layer has a thickness uniformity of approximately ten percent with other portions of the dielectric layer.

18. A method for making a semiconductor device comprising the steps of:

reacting, with a rapid thermal anneal in the temperature range of approximately 1000–1100° C. for a duration in the range of approximately 2–5 minutes, a semiconductor substrate;

subsequently depositing a $SiO_2$ layer over the semiconductor substrate, the $SiO_2$ layer deposited from TEOS to a thickness in the range of approximately 50–250 angstroms, at a temperature in the range of approximately 650–800° C.;

reheating the semiconductor substrate and the $SiO_2$ layer to a temperature in the range of approximately 800–1000° C. for a duration in the range of approximately 5–30 minutes in an atmosphere containing at least approximately 10 percent oxygen; and depositing a polysilicon layer over the $SiO_2$ layer to form a gate.

19. The method of claim 18 wherein the step of reacting the semiconductor substrate includes preventing the deposition of a film over the entire semiconductor substrate and using the particle to form an alloy region beneath a portion of a surface of the semiconductor substrate.

20. The method of claim 18 wherein the step of reheating the semiconductor substrate includes growing a thermal oxide layer between the $SiO_2$ layer and the semiconductor substrate.

* * * * *